(12) United States Patent
Lin et al.

(10) Patent No.: US 6,835,976 B2
(45) Date of Patent: Dec. 28, 2004

(54) SEMICONDUCTOR DEVICE AND ITS MANUFACTURE

(75) Inventors: Jun Lin, Kawasaki (JP); Hiroshi Minakata, Kawasaki (JP); Akihiro Shimada, Kawasaki (JP); Toshiya Suzuki, Kawasaki (JP); Daisuke Matsunaga, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 11 days.

(21) Appl. No.: 10/457,535

(22) Filed: Jun. 10, 2003

(65) Prior Publication Data

US 2003/0211699 A1 Nov. 13, 2003

Related U.S. Application Data

(62) Division of application No. 09/735,477, filed on Dec. 14, 2000, now Pat. No. 6,602,756.

(30) Foreign Application Priority Data

Aug. 11, 2000 (JP) ........................................ 2000-243930

(51) Int. Cl.[7] ........................ H01L 27/108; H01L 29/76; H01L 31/119
(52) U.S. Cl. ........................ 257/310; 257/296; 257/303; 257/306
(58) Field of Search ............................... 257/296, 301, 257/303, 306, 310, 379

(56) References Cited

U.S. PATENT DOCUMENTS

| 5,250,832 A | 10/1993 | Murai ........................ 257/306 |
| 5,254,505 A | 10/1993 | Kamiyama ................... 437/235 |
| 5,786,259 A | 7/1998 | Kang .......................... 438/396 |
| 5,863,706 A | 1/1999 | Komatsu et al. ............. 430/313 |
| 5,955,774 A | 9/1999 | Kang .......................... 257/533 |
| 6,100,132 A | 8/2000 | Sato et al. ................... 438/243 |
| 6,162,671 A | 12/2000 | Lee et al. .................... 438/238 |
| 6,350,650 B1 | 2/2002 | Lee ............................. 438/256 |

FOREIGN PATENT DOCUMENTS

| TW | 329037 | 4/1998 |
| TW | 365042 | 7/1999 |

*Primary Examiner*—Amir Zarabian
*Assistant Examiner*—Pamela E Perkins
(74) *Attorney, Agent, or Firm*—Westerman, Hattori, Daniels & Adrian, LLP

(57) ABSTRACT

A method of manufacturing a semiconductor device has the steps of: (a) forming a lower electrode made of rare metal above a semiconductor substrate; (b) depositing a capacitor dielectric film made of a high dielectric material or ferroelectric oxide on the lower electrode; (c) forming a laminated layer on the capacitor dielectric film, the laminated layer including an upper electrode layer made of rare metal and an adhesive layer with or without an $SiO_2$ mask layer thoreon; (d) patterning the laminated layer; (e) chemically processing the patterned, laminated layer to remove a surface layer of the laminated layer; and (f) forming an interlayer insulating film over the semiconductor substrate, covering the chemically processed, laminated layer. An adhesion force between the rare metal layer and insulating layer can be increased.

14 Claims, 14 Drawing Sheets

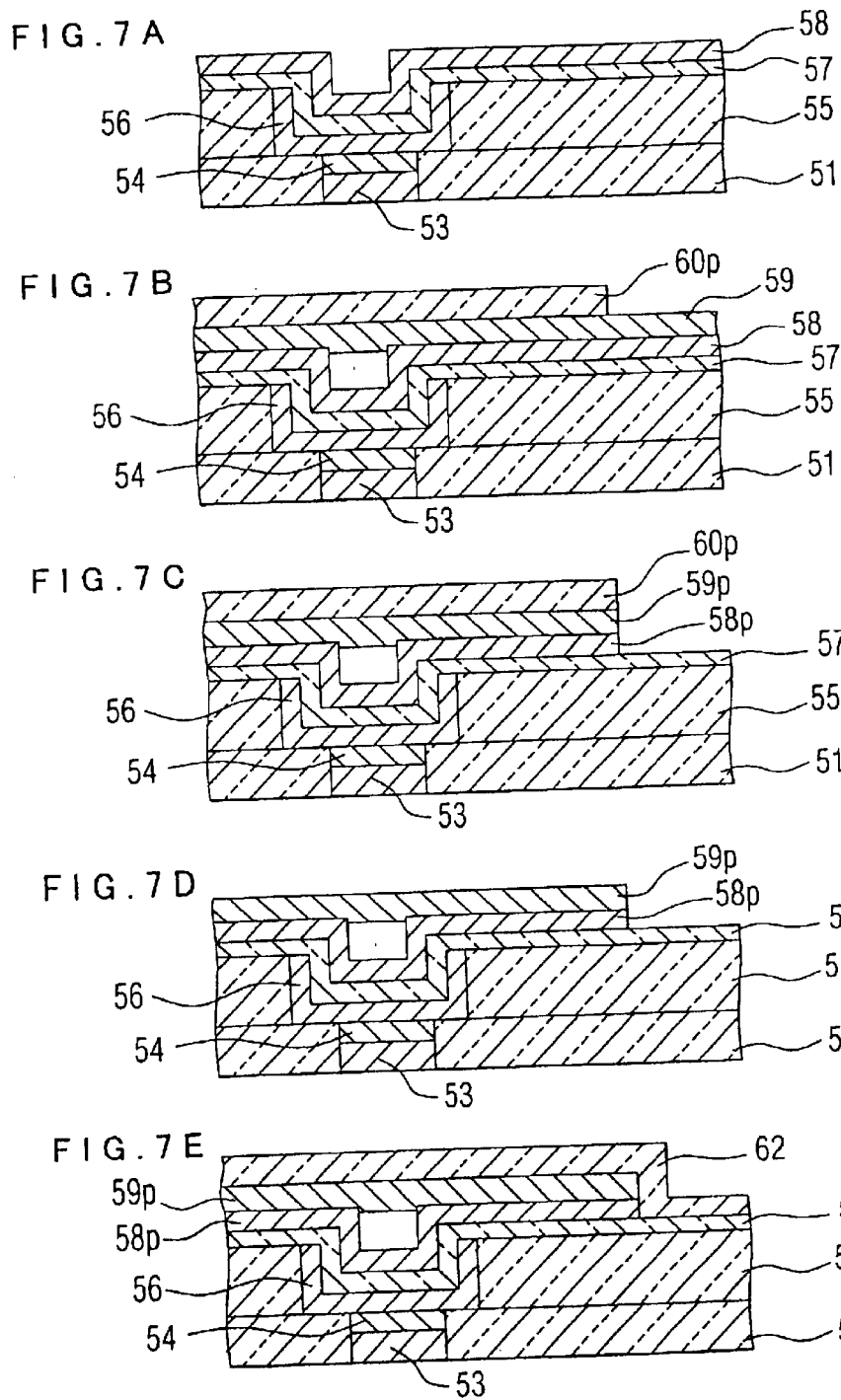

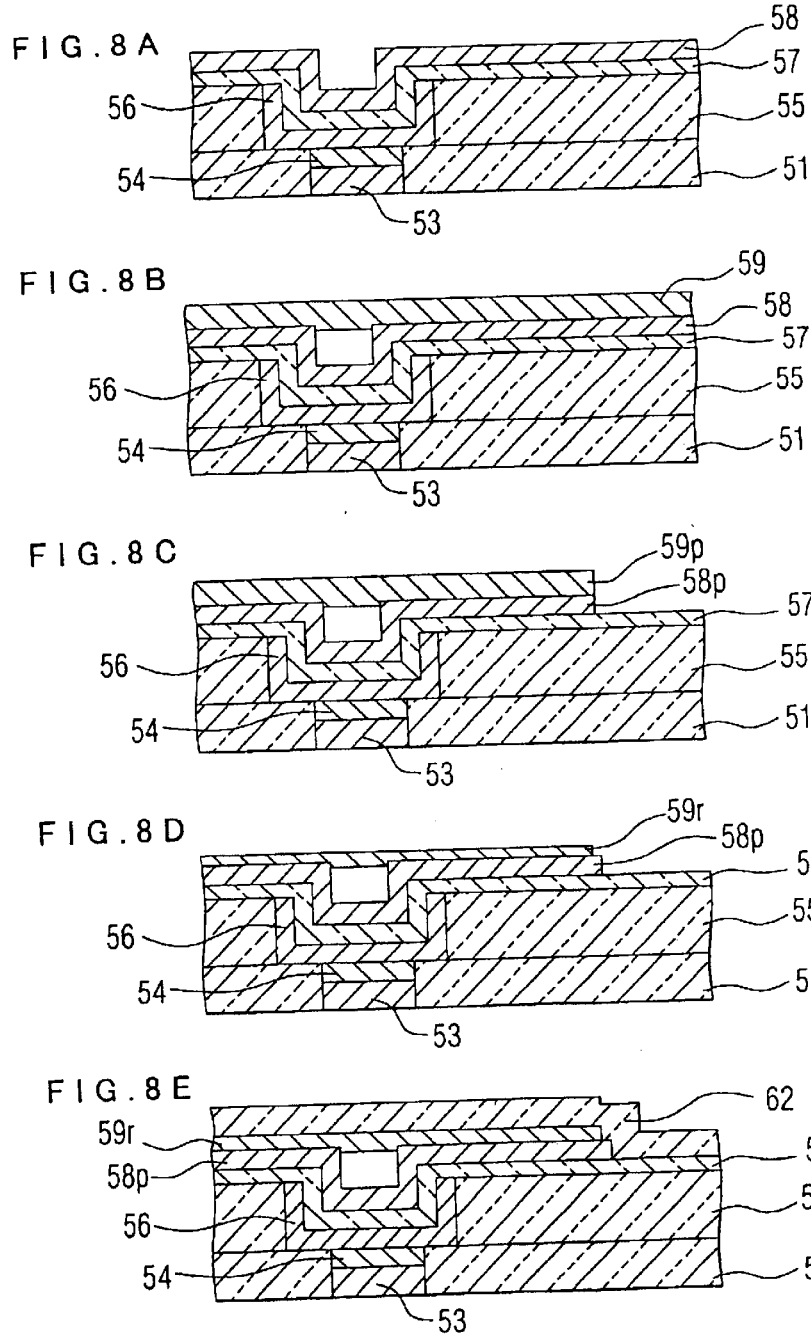

SEMICONDUCTOR DEVICE AND ITS MANUFACTURE

This application is a divisional of prior application Ser. No. 09/735,477 filed Dec. 14, 2000 now U.S. Pat. No. 6,602,756.

This application is based on Japanese Patent Application 2000-243930, filed on Aug. 11, 2000, the entire contents of which are incorporated herein by reference.

BACKGROUND OF THE INVENTION a) Field of the Invention

The present invention relates to a semiconductor device manufacture method and a semiconductor device, and more particularly to a method of manufacturing a semiconductor device having a capacitor with a capacitor dielectric layer made of dielectric oxide and to such a semiconductor device.

In this specification, a high dielectric substance means a dielectric substance having a relative dielectric constant of 20 or larger.

b) Description of the Related Art

Semiconductor memories such as a dynamic random access memory (DRAM) and a ferroelectric random access memory (FeRAM) use a capacitor as a memory element. The performance of a memory element can be improved by improving the capacitor performance. It becomes easy to form a DRAM of a micro fine pattern by using a high dielectric capacitor having a capacitor dielectric layer of a high dielectric constant. If a ferroelectric capacitor is used, a non-volatile memory can be formed.

If a high dielectric oxide layer or a ferroelectric oxide layer is used as a capacitor dielectric layer, the lower and upper electrodes of the capacitor are desired to be made of conductive metal oxide, metal which cannot be oxidized, or metal which maintains conductivity even if it is oxidized. By using the electrodes made of such materials, it becomes easy to form a capacitor dielectric layer having good dielectric characteristics.

As the metal which is not oxidized or maintains conductivity even if it is oxidized, rare metal which contains noble metal such as Ru and Pt is known. As the metal oxide having a conductivity, $RuO_x$, $SrRuO_3$ and the like are known. These metal and metal oxide have only a small adhesion force to insulating material such as silicon oxide. Semiconductor devices are required to use interlayer insulating films made of $SiO_2$ or the like. If the adhesion force to an interlayer insulating film is weak, it is difficult to use such materials in a semiconductor device.

It is desired to use electrodes made of rare metal for a capacitor having a good performance. However, the electrode made of rare metal has only a small adhesion force to an insulating film. It has therefore been desired to increase the adhesion force of an electrode made of rare metal to an insulating film.

SUMMARY OF THE INVENTION

It is an object of the present invention to provide a semiconductor device manufacture method capable of increasing the adhesion force between a rare metal layer and an insulating film.

It is another object of the invention to provide a semiconductor device excellent in the adhesion force between a rare metal layer and an insulating film.

According to one aspect of the present invention, there is provided a method of manufacturing a semiconductor device, comprising the steps of: (a) depositing a capacitor dielectric layer on a semiconductor substrate having a lower electrode made of rare metal formed on a surface of the semiconductor substrate, the capacitor dielectric layer being made of high dielectric oxide having a high dielectric constant or ferroelectric oxide; (b) forming a laminated layer on the capacitor dielectric layer, the laminated layer including an upper electrode layer made of rare metal and an adhesive layer; (c) patterning the laminated layer; (d) chemically processing the patterned, laminated layer to change a surface layer of the laminated layer; and (e) forming an interlayer insulating film over the semiconductor substrate, covering the chemically processed, laminated layer.

According to another aspect of the present invention, there is provided a method of manufacturing a semiconductor device, comprising the steps of: (a) depositing a capacitor dielectric layer on a semiconductor substrate having a lower electrode made of rare metal formed on a surface of the semiconductor substrate, the capacitor dielectric layer being a high dielectric layer having a high dielectric constant or a ferroelectric layer; (b) forming a laminated layer on the capacitor dielectric layer, the laminated layer including an upper electrode layer made of rare metal and an adhesive layer; (c) patterning the laminated layer; (d) thermochemically processing the patterned, laminated layer to change a surface layer of the laminated layer; and (e) forming an interlayer insulating film over the semiconductor substrate, covering the thermochemically processed, laminated layer.

According to another aspect of the present invention, there is provided a method of manufacturing a semiconductor device, comprising the steps of: (a) depositing a capacitor dielectric film made of dielectric oxide on a semiconductor substrate having a lower electrode made of Ru; (b) forming a laminated layer on the capacitor dielectric layer, the laminated layer having an upper electrode layer made of Ru, a TiN adhesive layer and an $SiO_2$ mask layer; (c) pattering the laminated layer; (d) chemically processing the patterned, laminated layer with HF containing solution to partially remove the $SiO_2$ mask layer; and (e) forming an interlayer insulating layer over the semiconductor substrate, covering the chemically processed $SiO_2$ mask layer.

According to another aspect of the invention, there is provided a semiconductor device comprising: a semiconductor substrate formed with an active element; a first interlayer insulating film formed on the semiconductor substrate; a lower electrode layer disposed on the first interlayer insulating film, made of rare metal, and electrically connected to the active element; a capacitor dielectric layer disposed on the lower electrode layer and made of high dielectric material having a high dielectric constant or ferroelectric material; an upper electrode layer disposed on the capacitor dielectric layer and made of rate metal; an adhesive layer disposed on the upper electrode layer and having a same plan shape as that of the upper electrode layer; an insulating mask layer disposed on the adhesive layer and having a side wall positioned retracted from a side wall of the adhesive layer; and an interlayer insulating film formed over the semiconductor substrate, covering the insulating mask layer, upper electrode layer, capacitor dielectric layer and lower electrode layer.

With the above-described manufacture steps and device structure, the adhesion force between a rare metal electrode and an insulating film such as an interlayer insulating film can be increased.

A semiconductor device with a high dielectric capacitor or ferroelectric capacitor having a high reliability interlayer insulating film can be provided.

BRIEF DESCRIPTION OF THE DRAWINGS

FIGS. 7A to 7E are cross sectional views of a semiconductor substrate illustrating main processes of an FeRAM manufacture method according to an embodiment of the invention.

FIGS. 8A to 8E are cross sectional views of a semiconductor substrate illustrating main processes of an FeRAM manufacture method according to another embodiment of the invention.

DETAILED DESCRIPTION OF THE PREFERRED EMBODIMENTS

In forming a three-dimensional capacitor having an elevational structure as well as a planer structure, it is desired to use chemical vapor deposition (CVD) to deposit a dielectric film and a pair of electrodes sandwiching the dielectric film. Attention has been drawn to a high dielectric layer made of $Ta_2O_5$ or the like and a ferroelectric layer made of $SrTiO_3$ or the like, as the capacitor dielectric layer.

In order to retain good dielectric characteristics of dielectric oxide, it is desired to perform heat treatment in an oxidizing atmosphere. From this reason, it is desired to use as the electrode material, metal which is not oxidized, metal which is conductive even if it is oxidized, or conductive metal oxide. For example, Ru is used as the electrode material.

However, an Ru electrode made through physical vapor deposition (PVD) has a weak adhesion force to an insulating film. An Ru electrode made through CVD has a weaker adhesion force to an insulating film. If an interlayer insulating film of $SiO_2$ is formed after a three-dimensional capacitor with Ru electrodes made through CVD is formed, this interlayer insulating film is usually peeled off from the electrode.

In order to reinforce the adhesion force at the interface between the weak adhesion metal and insulating film, an adhesive layer such as a TiN layer may be used.

The present inventors formed capacitors having a TiN layer inserted between an Ru electrode and an insulating film.

Figure 2A:
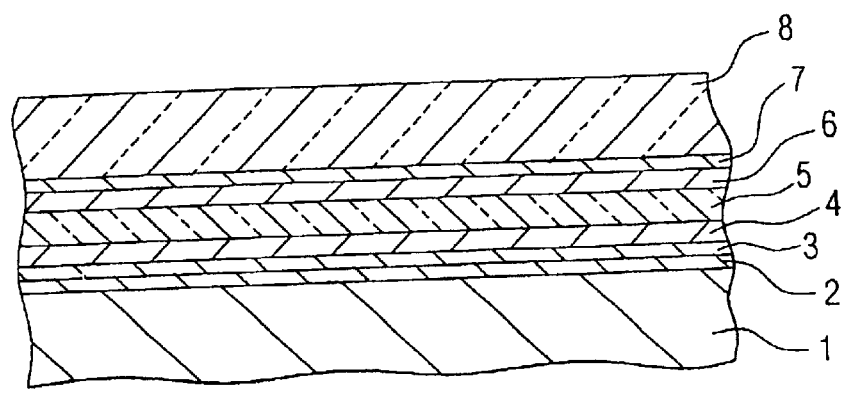
FIGS. 2A and 2B are cross sectional views of a semiconductor substrate explaining the experiments made by the present inventors.

As shown in FIG. 2A, a Ti layer 2 having a thickness of about 15 nm was formed on an Si substrate 1 by sputtering. On this Ti layer 2, a TiN layer 3 having a function of both an adhesive layer and a barrier layer was formed to a thickness of about 30 nm by reactive sputtering. On this TiN layer 3, a lower Ru electrode layer 4 was formed to a thickness of about 30 nm by CVD. Ru was deposited by CVD at a substrate temperature of 300 to 400° C. by using $Ru(EtCP)_2$, $Ru(CP)_2$ or $Ru(OD)_3$ as source gas.

On the lower Ru electrode layer 4, a $Ta_2O_5$ layer 5 to be used as a high dielectric layer of the capacitor was formed to a thickness of about 15 nm by CVD. $Ta_2O_5$ was deposited by CVD at a substrate temperature of 400 to 500° C. by using $Ta(O(C_2H_5))_5$ as source gas.

On the $Ta_2O_5$ capacitor dielectric layer 5, an Ru layer 6 to be used as an upper electrode was formed to a thickness of about 50 nm by CVD under conditions similar to those described above. On the upper Ru electrode layer 6, a TiN layer 7 functioning as an adhesive layer was formed to a thickness of about 500 nm by reactive sputtering. This TiN layer 7 has a conductivity so that it functions also as a portion of the upper electrode. On the capacitor lamination formed in the above manner, an $SiO_2$ inter-level dielectric (ILD) or interlayer insulating film 8 was formed to a thickness of about 500 nm by CVD by using tetraethylorthosilicate (TEOS) as source gas.

The capacitor structure formed in this manner has no peel-off between the interlayer insulating film 8 and underlying TiN layer 7. It can be seen that the TiN layer 7 increases the adhesion force between the Ru layer 6 and ILD 8.

Figure 2B:
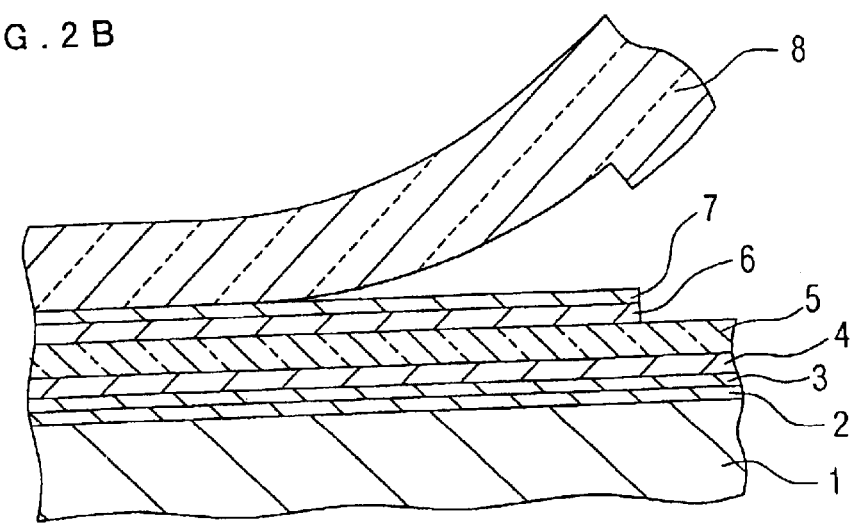

Next, as shown in FIG. 2B, after the capacitor lamination described above was formed, the TiN layer 7 and Ru layer 6 constituting the upper electrode were patterned through reactive ion etching by using a resist mask. $Cl_2$/He was used as etchant gas for the TiN layer, and $Cl_2/O_2$ was used as etchant gas for the Ru layer.

An interlayer insulating film 8 similar to that described above was formed by CVD, covering the patterned upper electrode. In this case, as shown in FIG. 2B, the interlayer insulating film 8 was peeled off from the TiN layer 7. More in detail, after the interlayer insulating film was formed, it was partially peeled off. After a tape test, it was completely peeled off.

If the upper electrode was not patterned, the interlayer insulating film 8 was not peeled off as shown in FIG. 2A. However, after the upper electrode was patterned, the interlayer insulating film 8 was peeled off. In order to study this phenomenon, elements contained in the interlayer insulating film 8, TiN layer 7 and Ru layer 6 were analyzed by secondary ion mass spectrometry (SIMS).

Figure 3A:
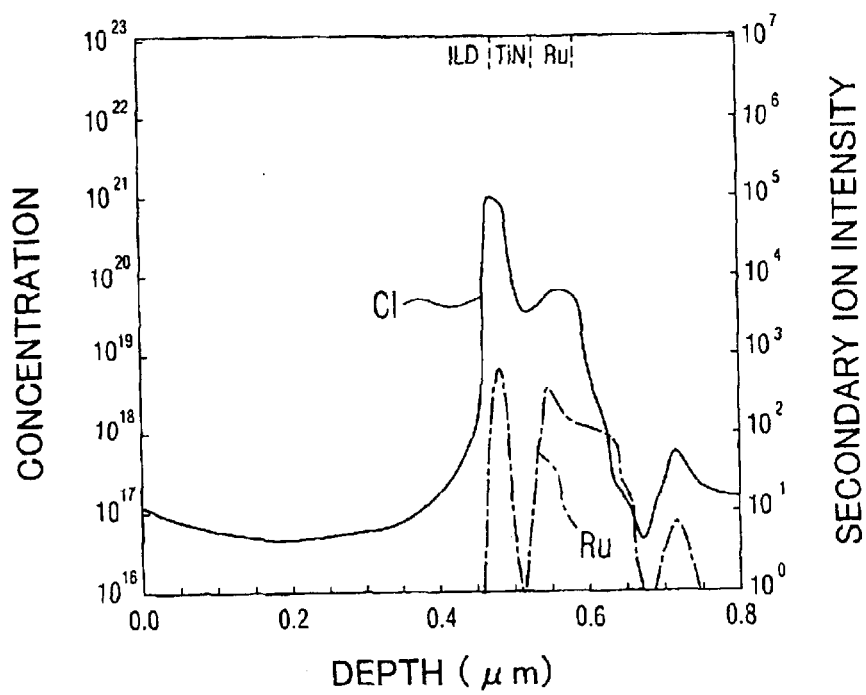
FIGS. 3A and 3B are graphs showing the SIMS measurement results of samples shown in FIGS. 2A and 2B.
Figure 3B:
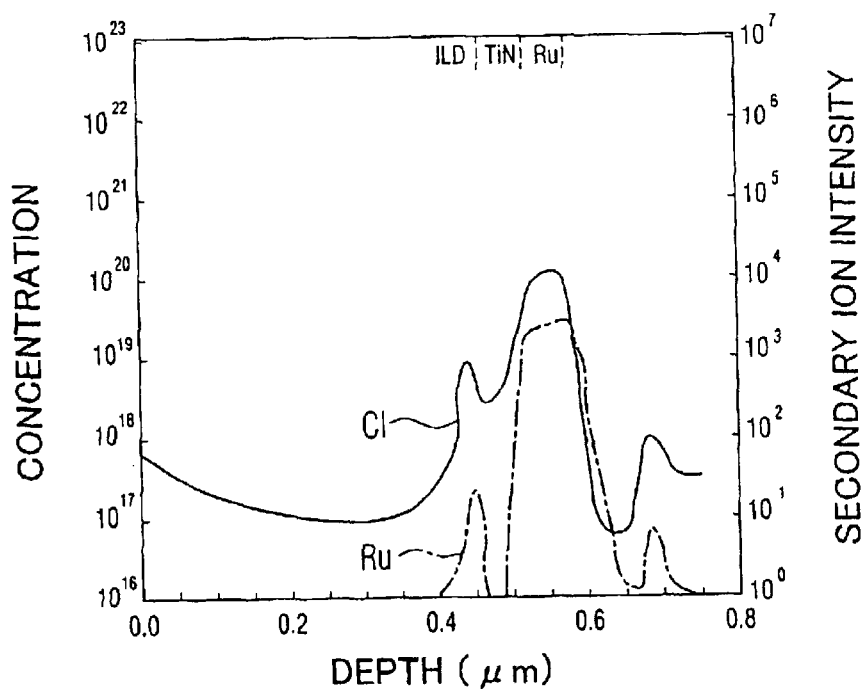

FIG. 3A shows the measurement results obtained after the upper electrode was patterned, and FIG. 3B shows the measurement results obtained when the upper electrode was not patterned. The distributions of only Cl and Ru to be particularly concerned about among the measured elements, are shown in FIGS. 3A and 3B. Any distribution to be particularly concerned about did not exist in the interlayer insulating film ILD.

At the interface between the interlayer insulating film ILD and TiN layer of the patterned structure, distinctive peaks of Cl and Ru appeared. In the sample not patterned, only small peaks of Cl and Ru appeared on the surface of the TiN layer, as shown in FIG. 3B. In contrast, in the sample patterned, distinctive peaks of Ru and Cl appeared.

Cl is an element constituting the etchant gas used when the TiN layer and Ru layer were etched. Ru is an element not contained essentially in the TiN layer. It can be considered that Ru elements removed from the Ru layer when the Ru layer is etched are attached to the surface of the TiN layer.

A considerable degradation in the function of the TiN layer as the adhesive layer may be ascribed to the attachment of Ru elements to the surface of the TiN layer. Studies were made on a method of suppressing the influence of Ru and/or Cl left on the structure after the upper electrode was patterned.

Figure 1A:
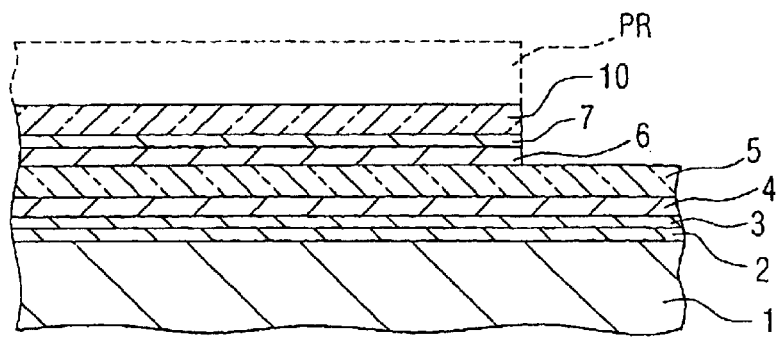
FIGS. 1A, 1B and 1C are cross sectional views of a semiconductor substrate illustrating a fundamental embodiment of the invention.

As shown in FIG. 1A, similar to the sample described above, a Ti layer 2, a TiN layer 3, an Ru layer 4, a $Ta_2O_5$ layer 5, an Ru layer 6 and a TiN layer 7 are formed on the surface of a silicon substrate 1. The thickness of each layer and its formation method are similar to those of the sample described above. The Ru layer was formed by CVD at a substrate temperature of 300 to 400° C. by using Ru(ethylcyclopentadieny)$_2$, Ru(cyclopentadieny)$_2$ or Ru(Octanedionate)$_3$ as source gas. The $Ta_2O_5$ layer was formed by CVD at a substrate temperature of 400 to 500° C. by using $Ta(O(C_2H_5))_5$ as source gas.

On the TiN layer 7, an $SiO_2$ layer 10 was formed to a thickness of about 500 nm by CVD by using TEOS as source gas. A photoresist layer was formed on this $SiO_2$ layer 10, and exposed and developed to form a resist pattern PR. By using the resist pattern PR as a mask, the $SiO_2$ layer 10 was etched. The resist pattern PR was thereafter removed. Removing the resist pattern was executed through ashing at a room temperature by using $Cl_2/CH_4$/forming gas as etchant gas.

The TiN layer 7 and Ru layer 6 were patterned by using the $SiO_2$ layer 10 as a mask. The TiN layer was etched by reactive ion etching (RIE) by using mixture gas of $Cl_2$/He as etchant gas, and the Ru layer was etched by RIE by using $Cl_2/O_2$ as etchant gas.

Figure 1B:
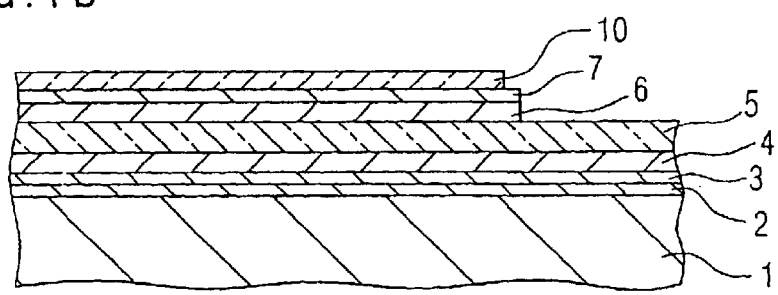

Thereafter, as shown in FIG. 1B, a surface treatment (chemical treatment) was performed using HF solution. The surface layer of the $SiO_2$ layer 10 was etched and removed by HF solution. Although the $SiO_2$ layer 10 was removed partially, it may be removed completely.

Figure 1C:
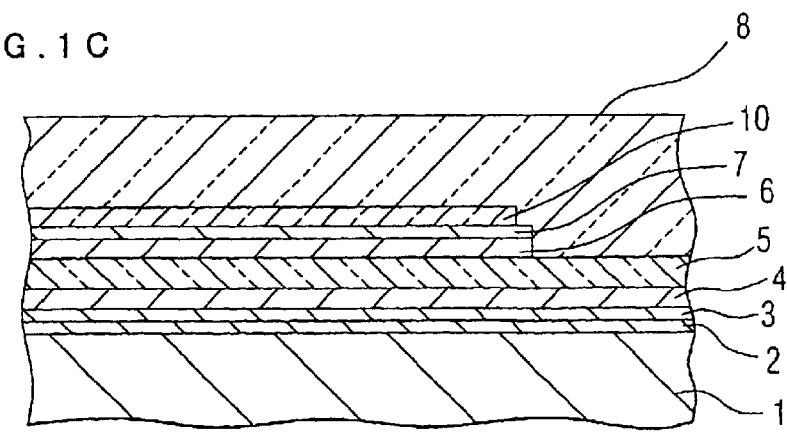

As shown in FIG. 1C, on the capacitor structure whose surface was subjected to the surface treatment, an interlayer insulating film 8 was deposited by CVD by using TEOS as source gas. The interlayer insulating film 8 formed on the capacitor structure in this manner was not peeled off. Although a tape test was performed to inspect the adhesion force, no peel-off was found. In contrast, with the sample shown in FIG. 2B, the interlayer insulating film was peeled off by the tape test.

It can be understood from this experiment that after the rare metal layer such as an Ru layer is etched, the surface on which etching residue may be attached is cleaned by a chemical process so that the adhesion force to the interlayer insulating film to be formed thereafter can be increased.

FIGS. 4A to 4F illustrate the main processes of a DRAM manufacture method according to an embodiment of the invention.

Figure 4A:
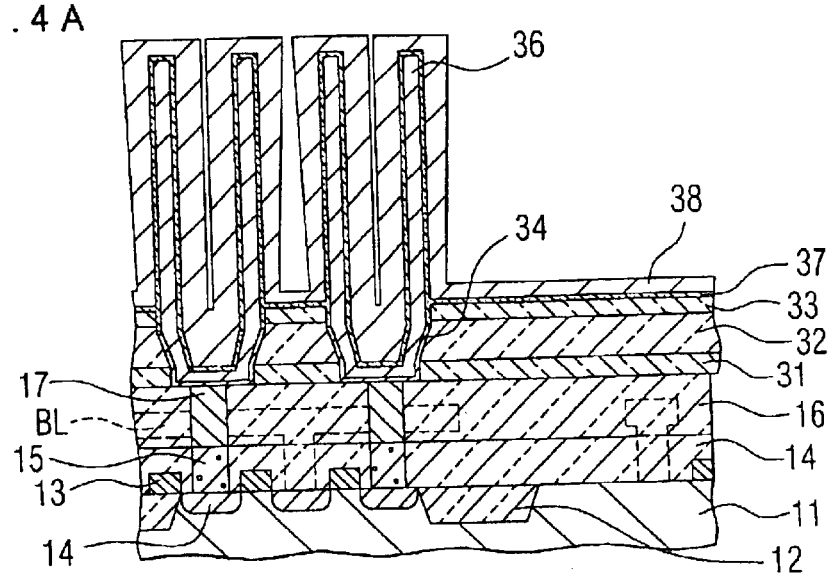
FIGS. 4A to 4F are cross sectional views of a semiconductor substrate illustrating main processes of a DRAM manufacture method according to an embodiment of the invention.

As shown in FIG. 4A, in a p-type surface region of an Si substrate 11, an $SiO_2$ isolation region 12 is formed by shallow trench isolation (STI). On the surface of an active region defined by the isolation region 12, an insulated gate electrode 13 is formed.

Figure 4B:
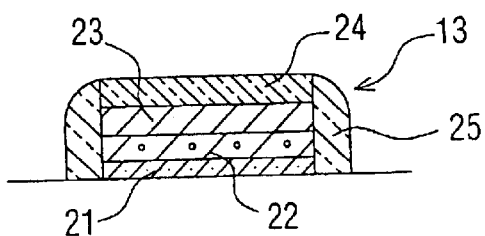

As shown in FIG. 4B, the insulated gate electrode has: a gate insulating film 21 of $SiO_2$ formed on the Si surface; a lower gate electrode 22 of polysilicon formed on the gate insulating film 21; an upper gate electrode 23 of WSi or the like formed on the lower gate electrode; an etch stopper layer 24 of SiN or the like formed on the upper gate electrode; and side wall etch stoppers 25 of SiN or the like covering the side walls of the gate electrodes. For simplicity purposes, in FIG. 4A and the following drawings, the insulated gate electrode 13 is shown by a simplified block instead of the detailed structure shown in FIG. 2B.

After the insulated gate electrode 13 is formed, a first interlayer insulating film 14 of $SiO_2$ or the like is formed. Contact holes are formed through the first interlayer insulating film 14 at desired locations. Plugs 15 of polysilicon, W or the like are buried in or deposited to fill the contact holes. These plugs are formed through CVD deposition and removal of unnecessary regions by CMP or the like.

Thereafter, a second interlayer insulating film 16 is formed over the whole substrate surface. The second interlayer insulating film 16 is formed by first depositing an insulating layer to an intermediate level, and after a bit line BL is formed, a remaining insulating film is deposited covering the bit line BL. Contact holes reaching the lower plugs 15 are formed through the second interlayer insulating film 16. Plugs 17 of W or the like are formed burying or filling the contact holes.

For example, the plug 17 is formed through CVD deposition of a blanket W layer and CMP or the like. Thereafter, a lamination of an SiN layer 31, an $SiO_2$ layer 32 and an SiN layer 33 is formed on the planarized surface. This lamination is used as a pedestal or plateau for preventing a capacitor to be later formed from falling down. The upper and lower SiN layers 31 and 33 each function as an etch stopper when an $SiO_2$ layer is etched.

A thick sacrificial film of $SiO_2$ or the like is formed on the SiN layer 33. An opening is formed through the sacrificial film, SiN layer 33, $SiO_2$ layer 32 and SiN layer 31 in the area where a cylinder type capacitor is to be formed. The surface of the plug 17 is therefore exposed on the bottom of the opening. After the opening is formed, a TiN layer 34 and a Ru layer 36 are deposited, and the Ru layer and TiN layer on the upper surface of the sacrificial film are removed by CMP or the like. In this manner, the lower electrode of the capacitor is formed.

Thereafter, the sacrificial film is removed by wet etching using HF solution or the like. During this removal process, the TiN layer 34 is removed at exposed area extending to the area downwardly retracted from the upper surface of the SiN layer 33. The outer surface of the Ru layer 36 is thus exposed.

A $Ta_2O_5$ layer 37 is deposited to a thickness of about 13 nm on the exposed surface of the capacitor lower electrode, by CVD at a temperature of 400 to 500° C. by using $Ta(O(C_2H_5))_5$ as source gas. This $Ta_2O_5$ layer 37 covers and fills the downwardly retracted area where the TiN layer 34 is removed, as well as the exposed whole surface of the Ru layer 36.

An Ru layer 38 is formed to a thickness of about 30 nm by CVD at a substrate temperature of 300 to 400° C. by using Ru(EtCP)$_2$ or Ru(CP)$_2$ as source gas, the Ru layer 38 covering the surface of the $Ta_2O_5$ layer 37. With these processes, a capacitor structure having the lower electrode 36, capacitor dielectric layer 37 and upper electrode 38 can be formed.

Figure 4C:
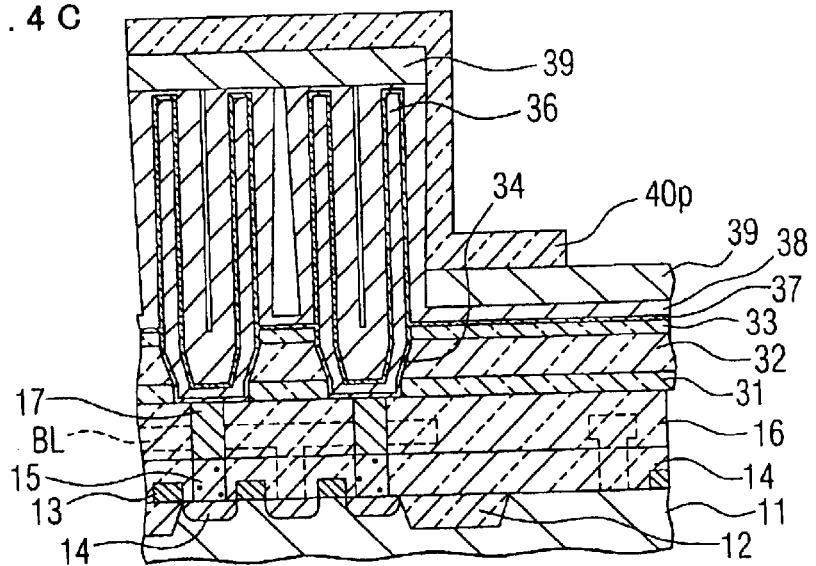

As shown in FIG. 4C, a TiN layer 39 is formed to a thickness of about 100 nm by physical vapor deposition (PVD). TiN is deposited by PVD mainly on the flat surface of the Ru layer 38 and scarcely on the nearly vertical side surface.

After the TiN layer 39 is formed, an SiO$_2$ layer is formed on the whole substrate surface to a thickness of about 400 nm by CVD. A resist mask is formed on the surface of the SiO$_2$ layer, and the SiO$_2$ layer is patterned to form a hard mask layer 40p of SiO$_2$. The resist pattern is thereafter removed.

Figure 4D:
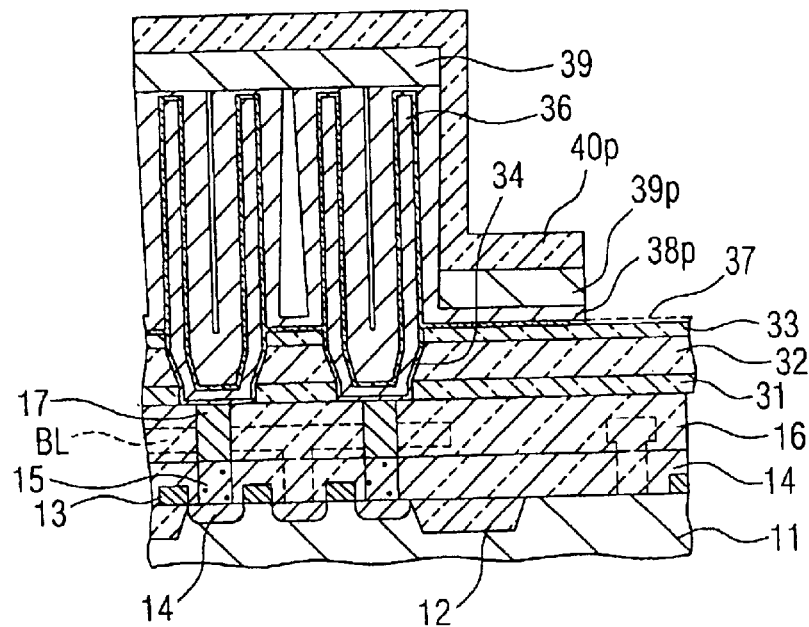

As shown in FIG. 4D, by using the hard mask 40p as a mask, the underlying TiN layer and Ru layer are etched to form a patterned TiN layer 39p and a patterned Ru layer 38p. The Ta$_2$O$_5$ layer 37 under the Ru layer 38 may and may not be patterned in the same shape. In the following drawings, the patterned Ta$_2$O$_5$ layer is shown. During the etching process using the hard mask layer 40p as a mask, the side walls of the TiN layer 39p and underlying Ru layer 38p are made flush.

Figure 4E:
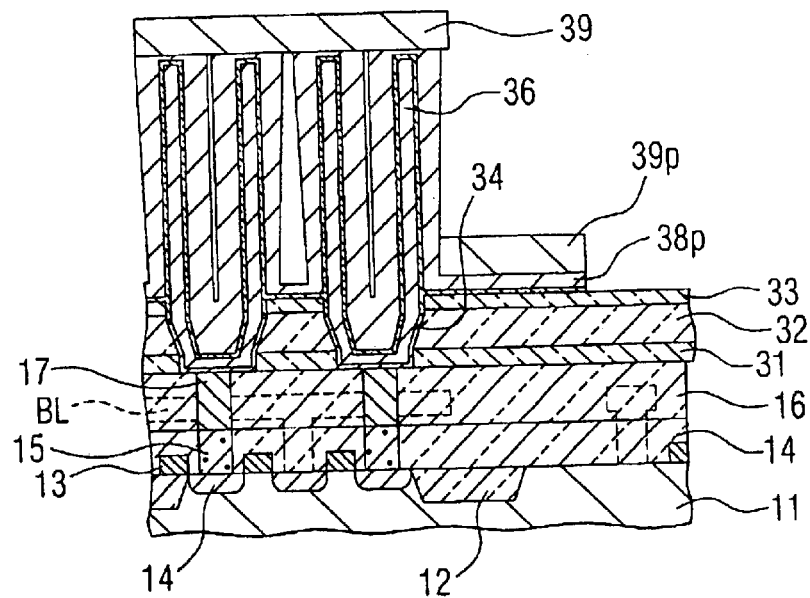

As shown in FIG. 4E, the whole or a partial thickness of the hard mask layer 40p of SiO$_2$ is removed. Although FIG. 4E shows the hard mask layer 40p completely removed, it may be partially left as shown in FIG. 1C, for example, by a thickness of 20 to 30 nm. In this case, as shown in FIG. 1C, the side wall of the SiO$_2$ hard mask layer 40p is positioned retracted from the side walls of the TiN layer 39p and Ru layer 38p. Since the surface of the Ru layer is covered with the hard mask layer, contamination to be caused by the exposed Ru surface can be avoided.

Figure 4F:
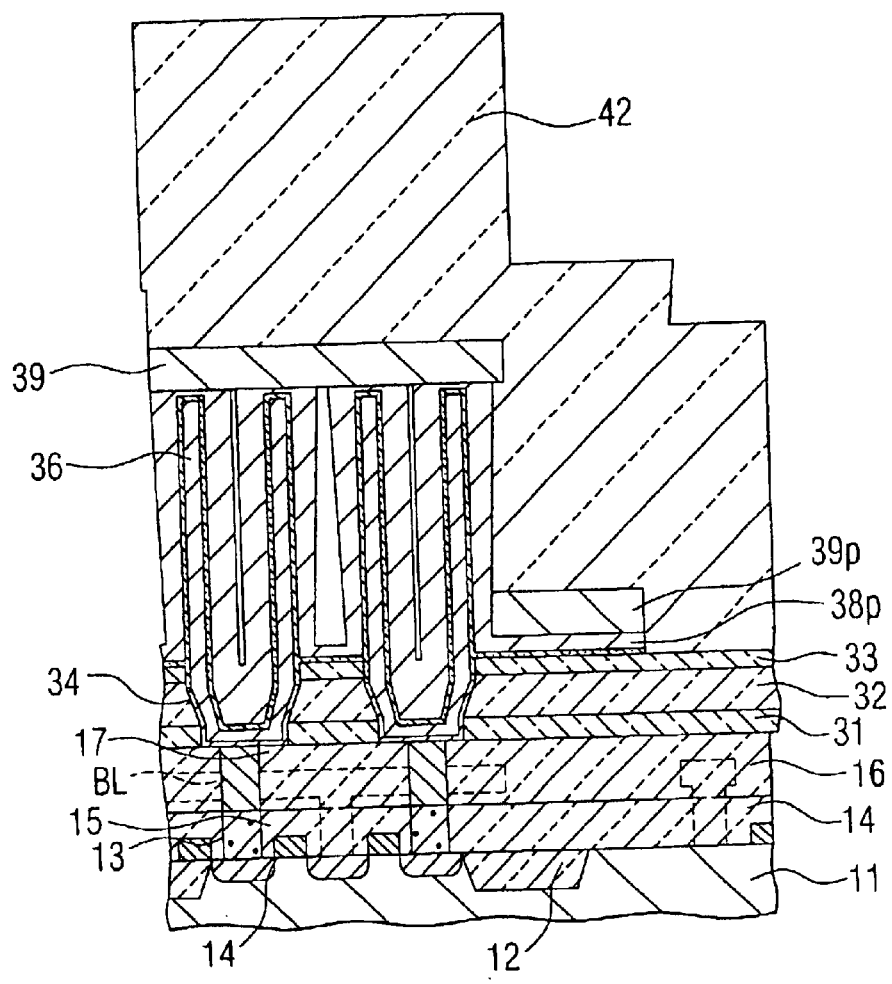

As shown in FIG. 4F, after the hard mask layer was completely or partially removed, an interlayer insulating film 42 of silicon oxide or the like was formed on the whole substrate surface, covering the capacitor structure.

DRAMs having this structure were actually formed and no peel-off of the interlayer insulating film was found. Semiconductor devices having a high reliability capacitor was able to be manufactured by using the Ru capacitor electrode.

Since the capacitor surface is covered with the SiO$_2$ layer 40p when the upper electrode is etched, it can be considered that byproducts during the etching are attached as residue to the surface of the SiO$_2$ hard mask layer 40p. It can be considered that if at least a surface layer portion of the SiO$_2$ hard mask layer 40p is etched and removed, residue left on the surface during the upper electrode etching is removed.

In this embodiment, the hard mask layer used for patterning the upper electrode of the capacitor is completely or partially removed after the upper electrode etching. It is also possible to suppress the influence of etching byproduct without using a hard mask layer.

FIGS. 5A to 5E illustrate the main processes of a manufacture method for a DRAM semiconductor device according to another embodiment of the invention.

Figure 5A:
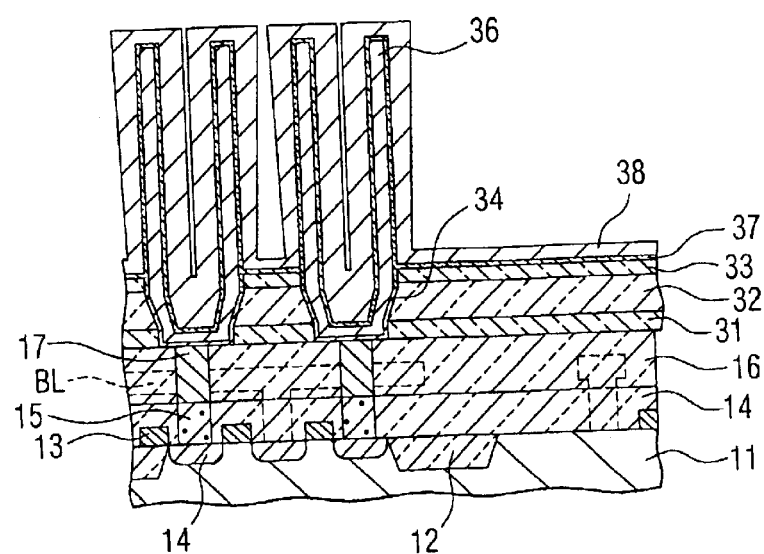
FIGS. 5A to 5E are cross sectional views of a semiconductor substrate illustrating main processes of a DRAM manufacture method according to another embodiment of the invention.

As shown in FIG. 5A, a MOS transistor and a capacitor of a DRAM cell are formed on the surface of a silicon substrate. The processes therefor are similar to those described with FIG. 4A.

Figure 5B:
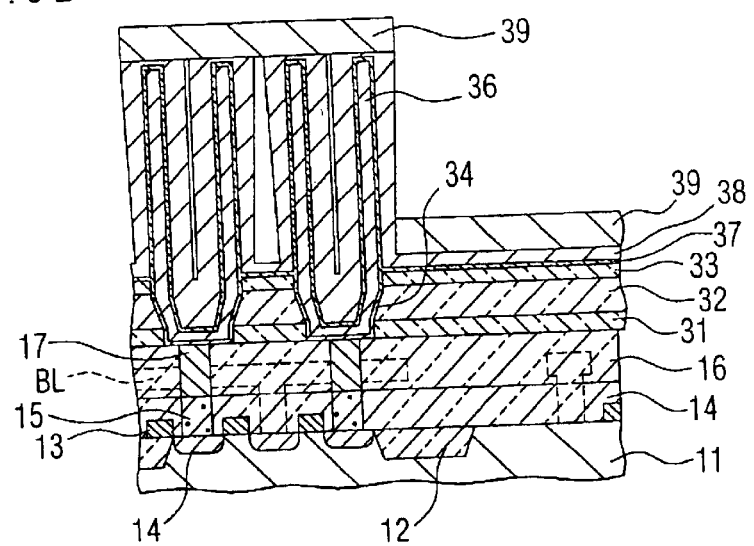

As shown in FIG. 5B, TiN is deposited downward on the flat surface by PVD to form a TiN layer 39 having a thickness of, for example, about 50 nm. In the process shown in FIG. 4C, the hard mask layer is deposited thereafter. In this embodiment, this hard mask layer is not formed.

Figure 5C:
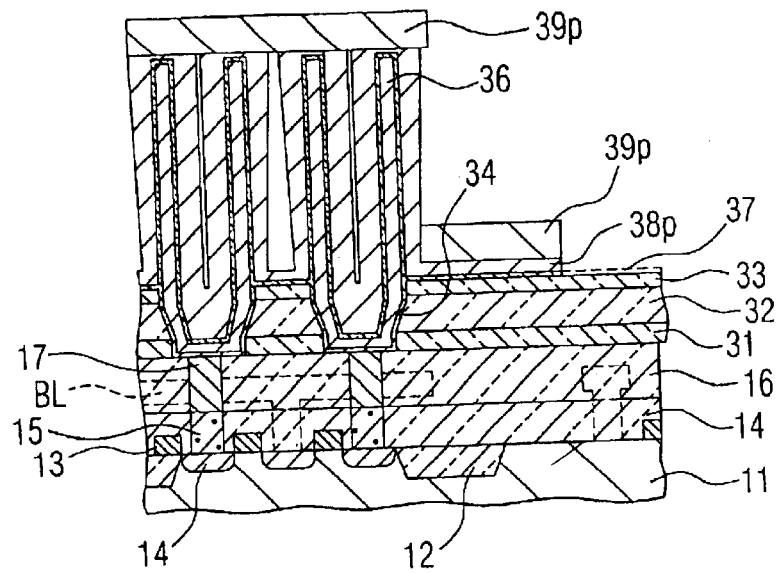

As shown in FIG. 5C, the TiN layer 39 is patterned by using a resist mask to form a patterned TiN layer 39p. The resist mask is thereafter removed. By using the TiN pattern 39p as a mask, the Ru layer is etched. The patterned Ru layer 38p has the same plan shape as that of the TiN pattern 39p. The capacitor dielectric film may also be etched in this process.

Figure 5D:
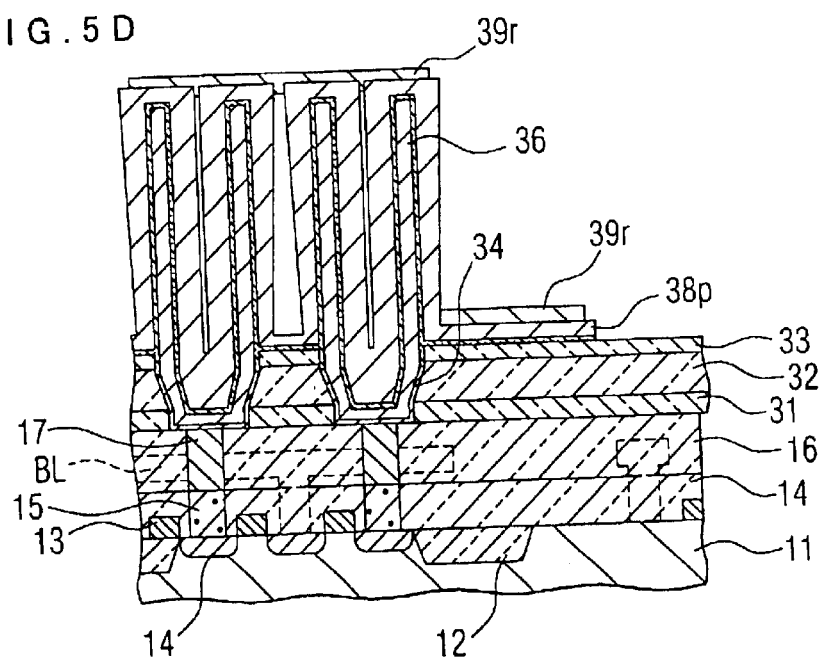

As shown in FIG. 5D, a partial thickness (surface layer) of the TiN pattern 39p used as the mask is removed by wet etching with H$_2$SO$_4$ containing solution such as H$_2$SO$_4$+ H$_2$O$_2$ solution, to leave a TiN layer 39r having a thickness of, for example, about 10 to 30 nm. Since the surface of the TiN layer is etched and removed, residue of the previous etching process attached to the surface of the TiN layer is removed.

The thickness of the left TiN layer 39r may be a thickness sufficient for an adhesive layer between the patterned Ru layer 38p and an interlayer insulating film to be formed on the patterned Ru layer 38p. The side wall of the TiN layer 39r is positioned retracted from the side wall of the patterned Ru layer 38p.

Figure 5E:
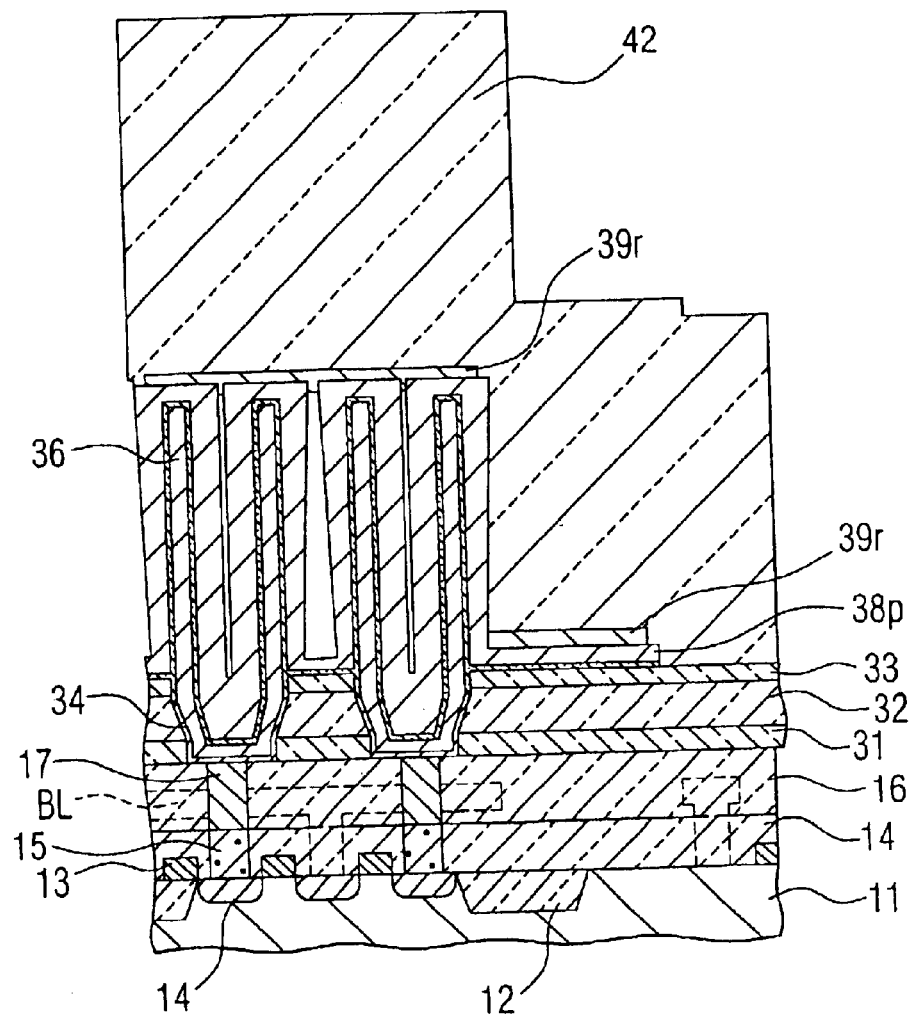

As shown in FIG. 5E, an interlayer insulating film 42 is deposited on the whole surface of the semiconductor substrate, covering the TiN layer 39r whose surface was etched.

Also in this embodiment, etching residue left when the Ru layer is etched is removed when the surface layer of the TiN layer 39p is etched, so that the influence of the etching residue can be suppressed.

FIGS. 6A to 6D illustrate the main processes of a manufacture method for a DRAM semiconductor device according to still another embodiment of the invention.

Figure 6A:
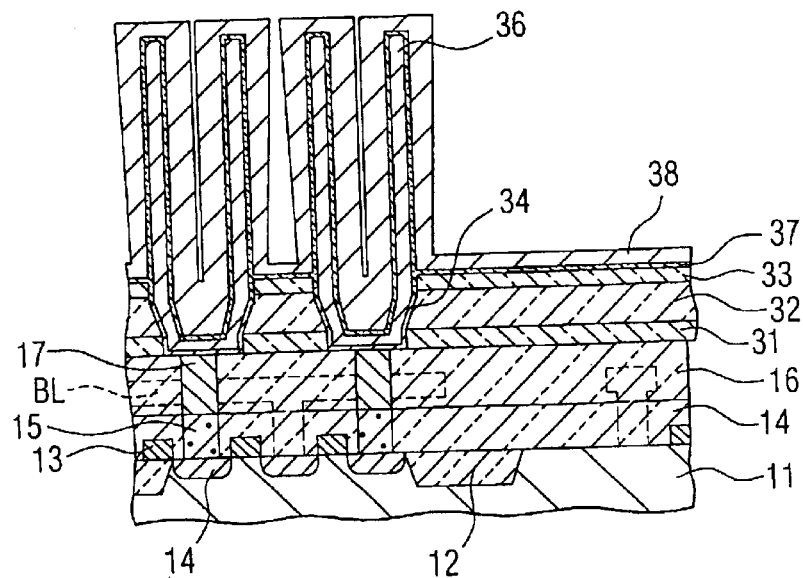
FIGS. 6A to 6D are cross sectional views of a semiconductor substrate illustrating main processes of a DRAM manufacture method according to still another embodiment of the invention.

As shown in FIG. 6A, a transistor and a capacitor of a DRAM cell are formed on the surface of a semiconductor substrate. This structure is similar to that shown in FIG. 4A.

Figure 6B:
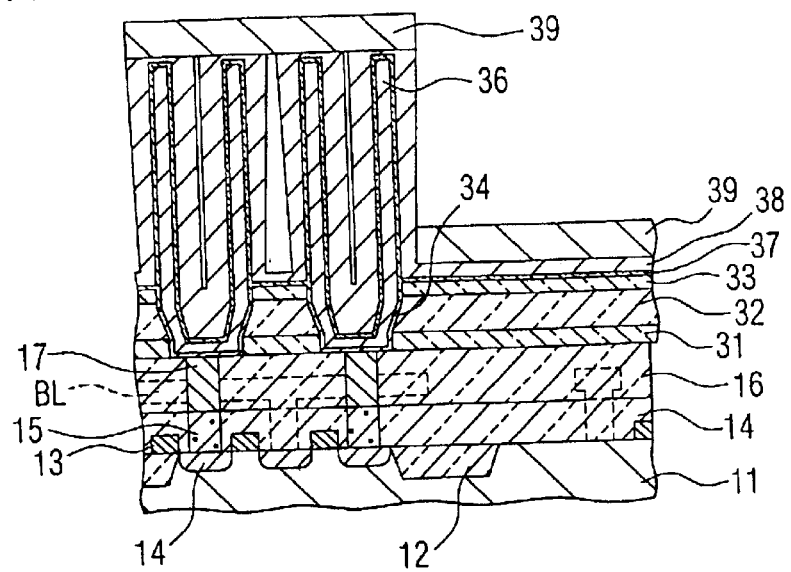

As shown in FIG. 6B, on the capacitor upper electrode layer 38, a TiN layer 39 is deposited by PVD to a thickness of, for example, about 50 nm. This structure is similar to that shown in FIG. 5B.

Figure 6C:
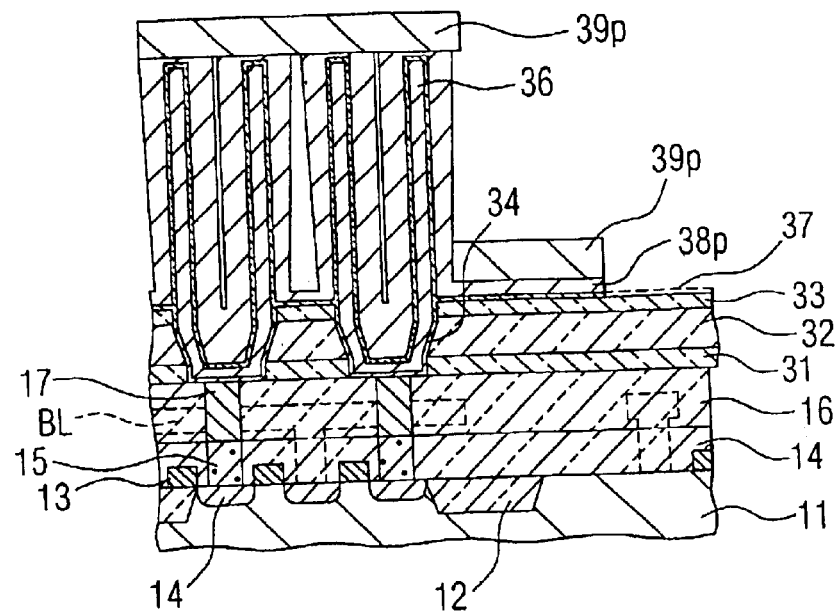

As shown in FIG. 6C, the TiN layer 39 is patterned by etching by using a resist mask to leave a patterned TiN layer 39p. The resist pattern is thereafter removed. By using the TiN layer 39p as a mask, the Ru layer 38 is etched to leave an Ru layer 38p having the same shape as that of the TiN layer 39p. In this state, it can be thought that residue of the Ru layer etching is attached to the surface of the TiN layer 39p.

Figure 6D:
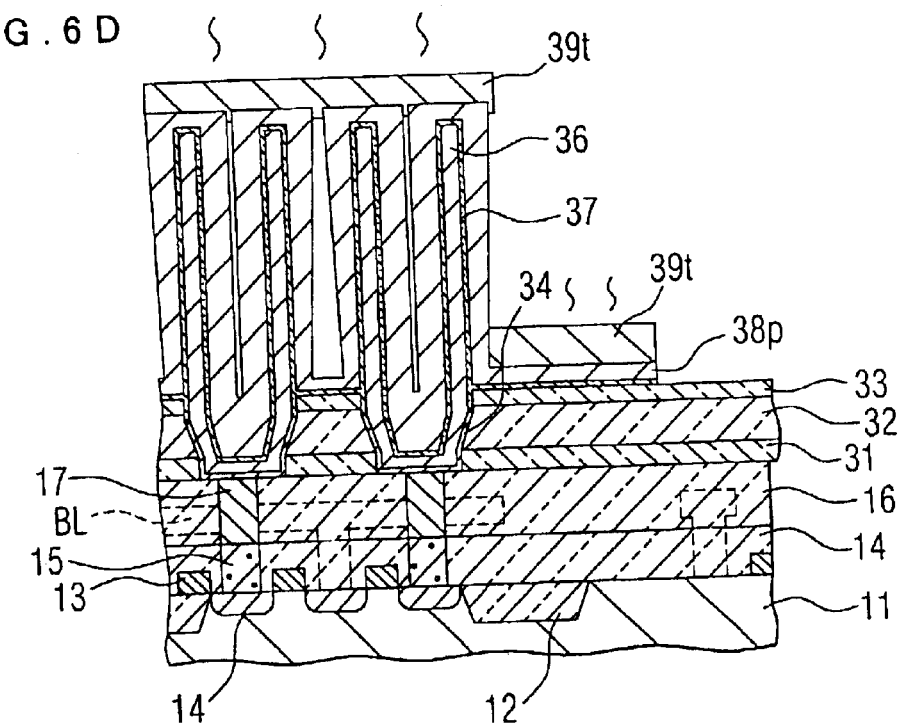

As shown in FIG. 6D, the semiconductor substrate is heated to 200 to 600° C., or more preferably to 300 to 500° C., for 1 to 100 minutes in an O$_2$ containing atmosphere to conduct a thermochemical reaction. Ru attached to the surface of the TiN layer 39p is removed in the form of RuO$_4$ (gas). If Cl is attached, Cl is replaced by O having a stronger chemical reaction force. In this manner, a TiN layer 39t with removed Ru or Cl on the surface can be obtained. Thereafter, similar to the above-described embodiments, an interlayer insulating film is formed covering the TiN layer 39t.

Methods of manufacturing a DRAM semiconductor device having cylinder type capacitors have been described. A capacitor is not limited only to a cylinder type capacitor. For example, a pillar type capacitor, a recess type capacitor or the like may be formed. If a ferroelectric layer is used in place of the high dielectric layer, an FeRAM can be formed in place of DRAM. In the following, manufacture processes for an FeRAM semiconductor device having a recess type capacitor will be described briefly.

As shown in FIG. 7A, a first interlayer insulating film 51 of SiO$_2$ is formed by CVD or the like. A contact hole is formed through the first interlayer insulating film 51 and a lamination of a W layer 53 and a TiN layer 54 is buried in the contact hole. A second interlayer insulating film 55 of SiO$_2$ is deposited on the first interlayer insulating film 51 by CVD or the like, covering the lamination. A recess for a capacitor is formed through the second interlayer insulating film 55 by etching or the like. After an Ru layer 56 is deposited by CVD, the Ru layer on the second interlayer insulating film 55 is removed by CMP or the like and the Ru layer in the recess is left.

A BST [(Ba, Sr)TiO$_3$] layer 57 is deposited on the surface of the Ru layer 56 by CVD. On the surface of the BST layer 57, an Ru layer 58 as the upper electrode is deposited by CVD.

As shown in FIG. 7B, a TiN layer 59 is formed on the Ru layer 58 by PVD, and an SiO$_2$ layer 60 is deposited on the TiN layer 59 by CVD. The SiO$_2$ layer is patterned by using a resist pattern to form a hard mask layer 60p of SiO$_2$. The resist pattern is removed thereafter.

As shown in FIG. 7C, by using the SiO$_2$ hard mask layer 60p as a mask, the TiN layer and Ru layer are etched to form a patterned TiN layer 59p and a patterned Ru layer 58p. With this etching process using the same hard mask layer 60p, the TiN layer 59p and Ru layer 58p have the same plan shape.

As shown in FIG. 7D, a partial or the whole thickness of the hard mask layer 60p is removed. Although the hard mask layer 60p is completely removed in FIG. 7D, it may be left partially as shown in FIG. 1C. In this case, the side wall of the left hard mask layer is positioned retracted from the side wall of the capacitor upper electrode.

As shown in FIG. 7E, an interlayer insulating film 62 is formed over the semiconductor substrate, covering the capacitor. With the above processes, an FeRAM semiconductor device having an interlayer insulating film having a strong adhesion force is formed.

FIGS. 8A to 8E illustrate the main processes of a manufacture method for an FeRAM according to another embodiment of the invention. As shown in FIG. 8A, plugs 53 and 54 are formed through an interlayer insulating film 51, and another interlayer insulating film is formed on the surfaces of the plug 54 and interlayer insulating film 51. A recess for a capacitor structure is formed through the interlayer insulating film 55. A BST layer 57 and an Ru layer 58 are formed by CVD on the recess structure. This arrangement shown in FIG. 8A is similar to that shown in FIG. 7A.

As shown in FIG. 8B, a TiN layer 59 is deposited by PVD on the Ru layer 58 to a thickness of, for example, about 50 nm. In this embodiment, an SiO$_2$ layer is not formed on the TiN layer 59.

As shown in FIG. 8C, after a resist pattern is formed on the TiN layer 59, the TiN layer is patterned by etching to form a patterned TiN layer 59p. The resist pattern is thereafter removed. By using the patterned TiN layer 59p as a mask, the Ru layer 58 is etched to form an Ru layer 59p having the same shape as that of the TiN layer 59p. Residue formed when the Ru layer was patterned may attach to the surface of the TiN layer 59p.

As shown in FIG. 8D, the surface layer of the TiN layer is etched and removed to leave a TiN layer 59r having a thickness of about 10 to 30 nm. With this etching process, the side wall of the TiN layer 59r is positioned retracted from the side wall of the Ru layer 59p.

By removing the surface layer of the TiN layer, etching residue such as Ru and Cl attached to the surface of the TiN layer is expected to be removed.

As shown in FIG. 8E, an interlayer insulating film 62 is formed over the semiconductor substrate, covering the processed surface of the capacitor structure. The interlayer insulating film formed on the cleaned surface of the TiN layer is expected to have a strong adhesion force.

FIGS. 9A to 9E illustrate the main processes of a manufacture method for an FeRAM according to still another embodiment of the invention.

Figure 9A:
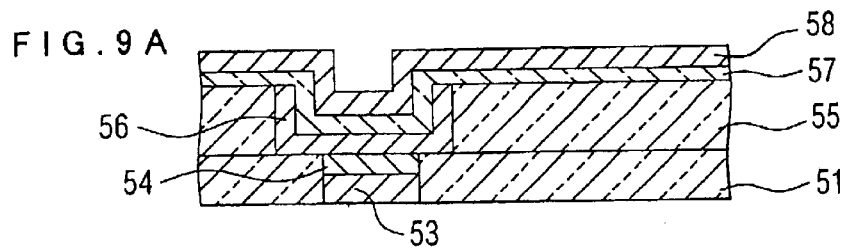
FIGS. 9A to 9E are cross sectional views of a semiconductor substrate illustrating main processes of an FeRAM manufacture method according to still another embodiment of the invention.

As shown in FIG. 9A, a capacitor structure buried or filling a recess in an interlayer insulating film is formed. This capacitor structure is similar to that shown in FIG. 7A.

Figure 9B:
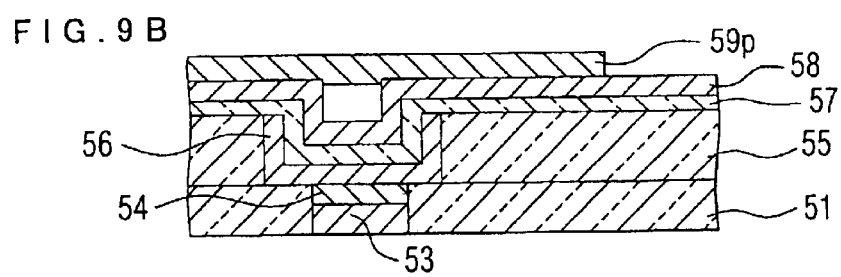

As shown in FIG. 9B, a TiN layer is deposited on the Ru layer 58 by PVD. This TiN layer is patterned by using a resist pattern to form a patterned TiN layer 59p.

Figure 9C:
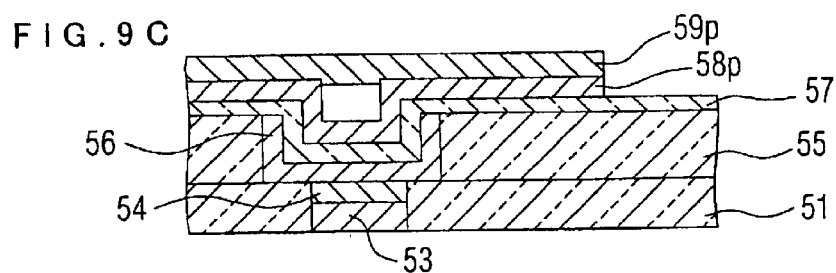

As shown in FIG. 9C, by using the TiN layer 59p as a mask, the underlying Ru layer is etched to form a patterned Ru layer 59p. The TiN layer 59p and Ru layer 59p have the same plan shape.

Figure 9D:
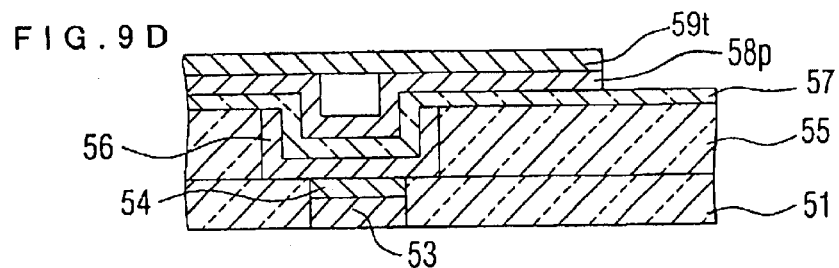

As shown in FIG. 9D, the semiconductor substrate is heated to 200 to 600° C., or more preferably to 300 to 500° C., for 1 to 100 minutes in an O$_2$ containing atmosphere. Ru and Cl attached to the surface of the TiN layer 59p are removed by the heat treatment in the O$_2$ containing atmosphere to produce a treated TiN layer 59t.

Figure 9E:
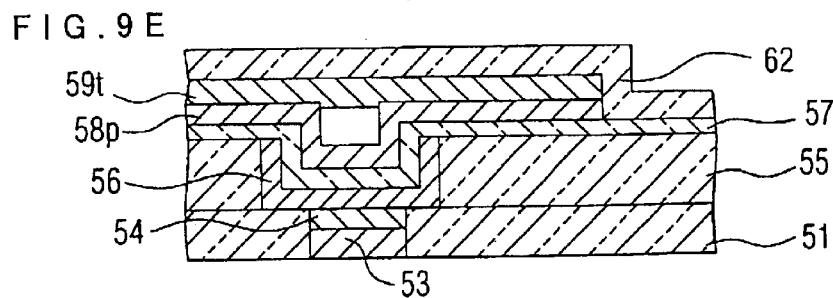

As shown in FIG. 9E, an interlayer insulating film 62 is formed on the thermally processed surface of the TiN layer. The interlayer insulating film formed on the cleaned surface of the TiN layer is expected to have a strong adhesion force.

With the above processes, an interlayer insulating film having a strong adhesion force can be formed on the surface of the capacitor having an Ru electrode.

The present invention has been described in connection with the preferred embodiments. The invention is not limited only to the above embodiments. Although an Ru layer is used as the capacitor electrode, other materials may also be used. For example, the lower electrode may be formed by using a rare metal layer such as Pt and Ir, a metal nitride layer, an SrRuO$_3$ layer, an RuO layer or an IrO$_2$ layer, and the upper electrode may be formed by using Ru, Ir, Pt, Pd, RuO, IrO$_2$ or SrRuO$_3$. These materials are also expected to present similar advantageous effects. Although a TiN layer is used as the adhesive layer, it is expected that other layers may also be used such as a Ta$_2$O$_5$ layer, a WN$_x$ layer, a TiON layer, and a WON layer. Although Ta$_2$O$_5$ or BST [(Ba, Sr)TiO$_3$] is used as the capacitor dielectric layer, SrTiO$_3$, Pb(Zr, Ti)O$_3$ or the like may also be used with expected similar effects. Although H$_2$SO$_4$ containing solution is used for partially etching the TiN layer, HF containing solution or OH$^-$+H$_2$O$_2$ containing solution may also be used with expected similar effects. It will be apparent to those skilled in the art that various modifications, improvements, combinations, and the like can be made by those skilled in the art.

What we claim are:

1. A semiconductor device comprising:
    a semiconductor substrate formed with an active element;
    a first interlayer insulating film formed above the semiconductor substrate;
    a lower electrode layer disposed on said first interlayer insulating film, made of rare metal, and electrically connected to the active element;
    a capacitor dielectric film disposed on said lower electrode layer and made of high dielectric material having a high dielectric constant or ferroelectric material;
    an upper electrode layer disposed on said capacitor dielectric film and made of rare metal;
    an adhesive layer disposed on said upper electrode layer and having a same plan shape as that of said upper electrode layer;
    a second insulating mask layer disposed on said adhesive layer and having a plan shape retracted from that of said adhesive layer; and an interlayer insulating film formed over said semiconductor substrate, covering said insulating mask layer, said upper electrode layer, said capacitor dielectric film and said lower electrode layer.

2. A semiconductor device according to claim 1, wherein said insulating mask layer is a silicon oxide layer.

3. A semiconductor device according to claim 1, wherein said rare metal is at least one of Ru, SrRuO$_3$, RuO$_x$, Pt and a combination thereof, and said adhesive layer is made of at least one TiN, Ta$_2$O$_5$, WN, TiON, WON and a combination thereof.

4. A semiconductor device according to claim 1, wherein said second interlayer insulating film is made of silicon oxide.

5. A semiconductor device according to claim 1, wherein said capacitor dielectric film is made of at least one Ta$_2$O$_5$, (Ba, Sr)TiO$_3$, SrTiO$_3$, Pb(Zr, Ti)O$_3$ and a combination thereof.

6. A semiconductor device according to claim 1, wherein said lower electrode has a cylindrical portion.

7. A semiconductor device comprising:

a semiconductor substrate formed with an active element;

a first interlayer insulating film formed above the semiconductor substrate;

a lower electrode layer disposed on said first interlayer insulating film, made of rare metal, and electrically connected to the active element;

a capacitor dielectric film disposed on said lower electrode layer and made of high dielectric material having a high dielectric constant or ferroelectric material;

an upper electrode layer disposed on said capacitor dielectric film and made of rate metal;

an adhesive layer disposed on said upper electrode layer and having a plan shape refracted from that of said upper electrode layer; and a second interlayer insulating film formed over said semiconductor substrate, covering said upper electrode layer, said capacitor dielectric film and said lower electrode layer.

8. A semiconductor device according to claim 7 wherein a surface of said adhesive layer has no residue formed when said upper electrode layer is patterned, and has a high adhesion force.

9. A semiconductor device according to claim 7, wherein said upper electrode is made of Ru, said adhesive layer is made of TiN, and said insulating mask layer is made of silicon oxide.

10. A semiconductor device according to claim 7, wherein said rare metal is at least one of Ru, SrRuO$_3$, RuO$_x$, Pt and a combination thereof, and said adhesive layer is made of at least one of TiN, Ta$_2$O$_5$, WN, TiON, WON and a combination thereof.

11. A semiconductor device according to claim 7, wherein said second interlayer insulating film is made of silicon oxide.

12. A semiconductor device according to claim 7, wherein said capacitor dielectric film is made of at least one of Ta$_2$O$_5$, (Ba, Sr)TiO$_3$, SrTiO$_3$, Pb(Zr, Ti)O$_3$ and a combination thereof.

13. A semiconductor device according to claim 7, wherein said upper electrode is made of Ru, said adhesive layer is made of TiN, and said insulating mask layer is made of silicon oxide.

14. A semiconductor device according to claim 7, wherein said lower electrode has a cylindrical portion.

* * * * *